(12) United States Patent
Takahashi et al.

(10) Patent No.: US 6,451,135 B1
(45) Date of Patent: *Sep. 17, 2002

(54) HIGH-PURITY COPPER SPUTTERING TARGETS AND THIN FILMS

(75) Inventors: Kazushige Takahashi; Osamu Kano, both of Kitaibaraki (JP)

(73) Assignee: Japan Energy Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 17 days.

(21) Appl. No.: 09/081,684

(22) Filed: May 20, 1998

(30) Foreign Application Priority Data

Jun. 2, 1997 (JP) ................................ 9-157331

(51) Int. Cl.$^7$ ................................ C23C 14/34
(52) U.S. Cl. ................ 148/432; 148/404; 420/469
(58) Field of Search .................. 148/432, 404; 420/469

(56) References Cited

U.S. PATENT DOCUMENTS

| | | | |
|---|---|---|---|
| 4,792,369 A | * 12/1988 | Ogata et al. | 148/404 |
| 5,316,802 A | * 5/1994 | Ebe et al. | 427/533 |

FOREIGN PATENT DOCUMENTS

| | | | |
|---|---|---|---|
| JP | 61149465 | * | 7/1986 |
| JP | 62089348 | * | 4/1987 |
| JP | 63210292 | * | 8/1988 |
| JP | 1055394 | * | 3/1989 |
| JP | 2-301585 A | | 12/1990 |
| JP | 2-301586 A | | 12/1990 |
| JP | 03173013 | * | 7/1991 |
| JP | 5-311424 A | | 11/1993 |
| JP | 07090430 | * | 4/1995 |

OTHER PUBLICATIONS

Pouch et al., "Surface Analysis of Amorphous Ta–Cu Alloy Thin Films", Proc. of the 9th Symp. of Appl. Surf Anal, vol. 11, No. 6, p. 400 ( Apr. 1987).

* cited by examiner

*Primary Examiner*—Sikyin Ip
(74) *Attorney, Agent, or Firm*—Akin, Gump, Strauss, Hauer & Feld, L.L.P.

(57) ABSTRACT

There is provided copper targets for sputtering capable of forming a deposition film with low electric resistance indispensable for high-speed operation elements and also with excellent thickness uniformity, and such thin copper films. A high-purity copper sputtering target is characterized by comprising up to 0.1 ppm each Na and K, up to 1 ppm each Fe, Ni, Cr, Al, Ca, Mg, up to 5 ppm each carbon and oxygen, up to 1 ppb each U and Th, and, excluding gaseous constituents, more than 99.999% copper. Preferably the average grain size on the sputter surface is 250 μm or below, with its dispersion thin plus or minus 20%. I(111)/I(200) of X-ray diffraction peak intensity on the sputter plane is at least 2.4 with its dispersion within plus or minus 20%.

13 Claims, 1 Drawing Sheet

[FIG. 1]
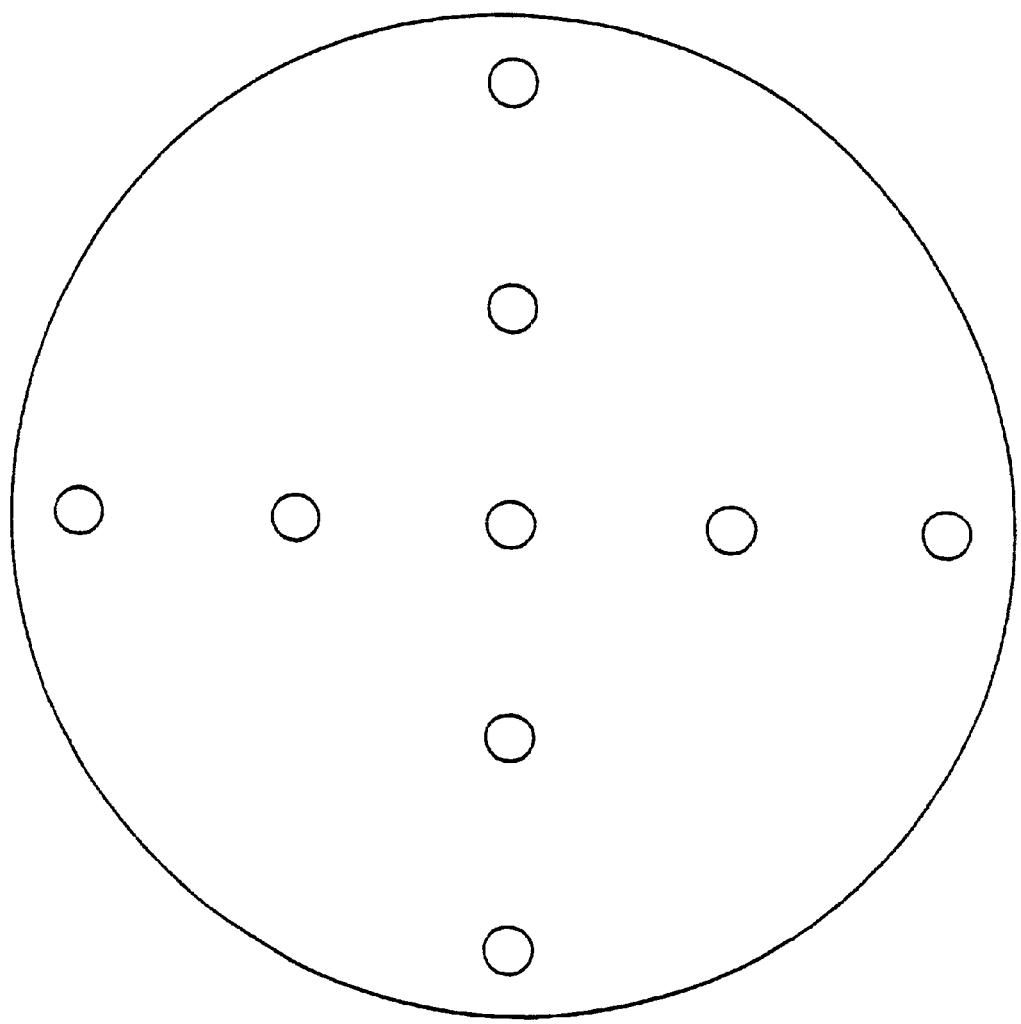

HIGH-PURITY COPPER SPUTTERING TARGETS AND THIN FILMS

BACKGROUND OF THE INVENTION

This invention relates to a high-purity copper sputtering target for the manufacture of thin film deposition materials on semiconductors as in large scale integration and relates also to a thin high-purity copper films of low resistivity obtained by sputtering with such high-purity copper sputtering target.

Aluminum or aluminum alloy (e.g., silicon-containing aluminum) has commonly been used as a wiring material for semiconductor integrated circuits and the like. However, such materials are presenting problems including increased resistance value and electromigration of wirings due to the recent tendencies toward higher degrees of integration which results further miniaturization of elements and the wirings. There have been some attempts to replace aluminum by a refractory metal such as molybdenum or tungsten, but their greater specific resistivities are a drawback.

Attempts have also been made to use copper in place of aluminum to take the advantage of its lower resistivity and greater resistance to electromigration. Nevertheless, pure copper can hardly be employed as a wiring material because it easily oxidizes and is highly reactive with silicon and silicon dioxide films. In the research for the development of copper wiring materials, therefore, emphasis has been laid on an improvement in the oxidation resistance of copper by the controlled addition of another specific element or elements. Most of the researches are directed to the coating of the resulting thin film with an oxide (or nitride) of the added element so as to prevent further oxidation of the film under the coat.

For example, Japanese Patent Application Kokai No. 64-59938 proposes a method which consists of depositing a wiring pattern of an alloy of copper and at least one element chosen from among Ti, Zr, Al, B, and Si, and annealing the deposited wiring pattern in a nitrogen-containing atmosphere whereby a substance that forms the alloy with copper is diffused over the surface to form a nitride barrier.

Patent Application Kokai No. 6-177128 discloses a thin film wiring material of a copper alloy containing 0.02–20 atom % Al or Si. The alloy is oxidized to form an oxide film in which Al or Si is diffused and concentrated on the wiring surface so as to enhance the oxidation resistance of the surface.

A major problem common to the abovementioned methods is an increase in electric resistance by the addition of another element. An increased electric resistance retards signal transmission and adds to the power consumption. For this reason it has been necessary to put an upper limit to the proportion of the additional element so that the electric resistance is as low as that of pure Al, i.e., 2.7 $\mu\Omega$·cm or less.

As noted above, the efforts to make use of copper as a wiring material have depended largely upon the addition of a specific element, and few attempts have been made to use pure copper itself. However, the recent progress in device structures and barrier materials are altering the situation. For one thing, modern technologies including chemical mechanical polishing (CMP) have simplified device construction and enabled the use of devices with seemingly low oxidation resistance according to ordinary standards. For the other, the development of new barrier materials exclusively designed for copper has raised pure copper to a level high enough for practical use as a wiring material.

Under these circumstances the wiring deposition of pure copper that had been regarded as almost impossible is now rapidly gaining practicality.

In reality, however, the past scanty research on wiring deposition of pure copper has given little impetus to the study of the conditions required of copper wiring material, specially as a material for sputtering target. It should be pointed out, above all, that no copper sputtering target has been developed which has low enough electric resistance for the element that performs high-speed operation for a computer or the like and which is capable of forming a thin film with excellent thickness uniformity.

OBJECT OF THE INVENTION

It is an object of the present invention to provide copper sputtering targets capable of forming wiring deposition films having excellent thickness uniformity as well as the low electric resistance essential for high-speed operation elements and also provide such thin copper films.

SUMMARY OF THE INVENTION

After an intensive research, the present inventors have now found that, in order to produce a film of low enough electric resistance, the impurity contents in the target must be kept below certain numerical values. It has also been found necessary to limit down to certain levels the proportions of the elements that have been added for alloying purposes and, if the uniformity of film thickness is to be attained, the dispersions of grain size and crystalline orientation of the target must be controlled.

On the basis of these findings, this invention provides:
1. A high-purity copper sputtering target characterized by comprising up to 0.1 ppm each Na and K, up to 1 ppm each Fe, Ni, Cr, Al, Ca, Mg, up to 5 ppm each carbon and oxygen, up to 1 ppb each U and Th, and, excluding gaseous constituents, more than 99.999% copper.
2. A sputtering target according to 1 above wherein the average grain size on the sputter surface is 250 $\mu$m or below And the dispersion of the average grain size from location to location is within plus or minus 20%.
3. A sputtering target according to 1 or 2 above wherein the ratio, I(111)/I(200), of the X-ray diffraction peak intensity I(111) on the (111) plane to the X-ray diffraction peak intensity I(200) on the (200) plane is at least 2.4 and the dispersion of the ratio I(111)/I(200) in the sputter surface is within plus or minus 20%.
4. A sputtering target according to any of 1 to 3 above wherein X-ray diffraction peak width at half height in the sputter surface on the (111) plane is 2θ≦0.3 deg.
5. A sputtering target according to any of 1 to 4 above wherein it also contains up to 5 ppm each Si, Ag, Ti, Zr, Hf, and B.
6. A sputtering target according to any of 1 to 5 above wherein it has an electric resistance of 1.9 $\mu\Omega$·cm or less.
7. A thin high-purity copper film characterized by an electric resistance of 2.0 $\mu\Omega$·cm or less produced by sputtering with a high-purity copper sputtering target according to any of 1 to 6 above.

BRIEF EXPLANATION OF THE DRAWING

FIG. 1 is a schematic view of a target, showing points of sampling for the investigation of its characteristics.

EMBODIMENTS OF THE INVENTION

The invention will now be described in detail.

The high-purity copper sputtering target of this invention has an impurity content reduced to a minimum.

In order to ensure the reliability of performance of a semiconductor device formed by sputtering, it is important to minimize the proportion of impurities deleterious to semiconductor devices. Particularly deleterious impurities include:

(1) alkali metal elements such as Na and K;

(2) radioactive elements such as U and Th; and (3) transition metal elements such as Fe, Ni, and Cr.

Alkali metal elements such as Na and K are especially diffusible and migrate easily through a insulation film, with the possibility of causing deterioration of MOS-LSI interface characteristics. Their proportions, therefore, should be limited to at most 0.1 ppm each, preferably 0.02 ppm each.

Radioactive elements such as U and Th emit alpha rays which can be responsible for soft errors of semiconductor elements. That is why their proportion should be severely controlled, to 1 ppb or less, preferably to 0.5 ppb or less, each.

Transition metal elements such as Fe, Ni, and Cr too can cause troubles of interface connections. Hence their proportions should be 1 ppm or less, preferably 0.1 ppm or less, each.

Besides these elements, particularly those harmful to semiconductor elements, other impurities must also be minimized. Generally, electric resistance is a function of the impurity level and the smaller the impurity content the lower the electric resistance. Thus, in order to lower the electric resistance, a higher purity is desirable. When the actual cost of producing a sputtering target and other Considerations are taken into account, it would be of great practical value to control the impurity level so that the resulting thin film shows an electric resistance below 2.0 $\mu\Omega\cdot$cm.

Thus not only the heavy metal elements but also such light metal elements as Al, Ca, Mg must be reduced in proportions, to 1 ppm or less, preferably 0.1 ppm or less, each.

Gaseous ingredients such as carbon and oxygen too are undesirable in that they increase the electric resistance of the resulting film and have adverse effects upon the surface configuration of the film. The carbon is included herein as a gaseous ingredient since it is a gasifiable ingredient. Their contents should be kept to 5 ppm or less, preferably 1 ppm or less, each.

Research has suggested the desirability of minimizing also the proportions of Si, Ti, Zr, Hf, B, and Ag that have been often added as alloying elements, for the sake of reduced electric resistance. Their proportions should be 5 ppm or less, preferably 0.5 ppm or less, each.

The overall copper purity, excluding the gaseous ingredients, should be at least 99.999%.

For the uniformity in thickness of the film that is formed by sputtering, it is essential to restrict the dispersions of the crystalline grain size and orientation of the target.

As for the grain size, both the average grain size in the sputter surface and the variation of the average grain size from location to location influence the uniformity of film thickness. If the average grain size is greater than 250 $\mu$m, the is no longer possible to limit the average dispersion of film thickness on an 8-in. wafer to 2.0 or less. A locational variation in excess of 20% is undesirable either, because the average dispersion of film thickness exceeds 2.0 even though the average grain size is below 250 $\mu$m. Thus, an average grain size in the sputter surface of 250 $\mu$m or below and a locational variation in the average grain size of not exceeding plus or minus 20% are requisites for the realization of film thickness uniformity.

On the other hand, crystalline orientation too has similar influences upon the uniformity of film thickness. The Joint Committee of Power Diffraction Standard (JCPDS) reports that a wholly random orientation gives an X-ray diffraction peak intensity I(111)/I(200)=2.08. Investigations by the present inventors, however, have revealed that intensified orientation in the (111) plane rather than wholly random orientation produces better film thickness uniformity. The reason is as follows.

The sputtering rate depends on the plane of orientation. The sputtering rate thus varies from location to location where the orientation is at random, resulting in less uniformity of film thickness than with the orientation in a specific plane. In the case of copper, the (111) plane is the densest of its crystallographic planes, where the density of the sputtered atoms released is higher than in the other planes, leading to superior film thickness uniformity.

An average dispersion of film thickness of 2.0 or below can be realized when the ratio, I(111)/I(200), of the X-ray diffraction peak intensity I(111) on the (111) plane to the X-ray diffraction peak intensity I(200) on the (200) plane is at least 2.4 and the dispersion of the ratio I(111)/I(200) in the sputter surface is within plus or minus 20%.

A work deformed layer of the target surface is another factor influencing the film deposition characteristic. The term "work deformed layer of the target surface" is used to mean a layer of the target surface with fractured crystallinity or microcracks and other flaws formed under the pressure of a cutting tool during machining (usually on a lathe). The presence of a work deformed layer is known to have unfavorable effects; e.g., instable deposition rate, increased film resistance, and inadequate film thickness uniformity. These effects can be avoided by presputtering the work deformed layer immediately before ordinary sputtering. The present inventors have improved the film deposition performance by machining each target in such manner as to minimize its deformed layer. Since the presence of a deformed layer expands the half width of X-ray diffraction, the present inventors estimated the volume of the deformed layer present from the X-ray diffraction peak width at half height. It has been found as a result that, if a favorable deposition performance is to be secured, it is necessary that the X-ray diffraction peak width at half height in the sputter surface on the (111) plane be $2\theta \leq 0.3$ deg.

Such a high-purity copper target with a minimized impurity content and outstanding film thickness uniformity as described above can be made in the following way.

Ordinary electrolytic copper is electrorefined in a bath of sulfuric acid or nitric acid to reduce the impurity content and attain a high-purity level of at least 99.9999%. The copper is then vacuum induction melted and a high-purity copper ingot is obtained. The ingot is hot worked by hot forging, hot rolling, etc., cold worked by cold rolling, cold forging, etc., and then heat treated. Hot working to a working ratio of 50% or more, cold working to a ratio of over 30%, and heat treatment at 350–500° C. for 1–2 hours are desirable. The hot working is indispensable for destroying the cast structure and refining and adjusting the ingot to a structure of equiaxed grains. Once the cast structure has been destroyed, cold working and heat treatment are carried out under strictly controlled conditions to refine the grain size and control the crystalline orientation. The cold working ratio influences the grain size after the heat treatment, and the greater the working ratio the finer will be the grains to be obtained. It is effective too in attaining a crystalline orientation as desired. Meanwhile, the material begins to harden owing to work hardening as the working ratio increases. The hardening beyond a certain level can cause cracking during the course of working. For these reasons the cold working ratio should be at most about 90%. The temperature and time for the heat treatment have certain bearings upon the grain size after recrystallization. Proper choice of heat treatment conditions renders it possible to obtain a copper plate having a desired grain size. A too low temperature should be averted because it would effect insufficient recrystallization and produce a structure not thoroughly freed from working strains. Too high a temperature, on the other hand, induces grain growth which coarsens the crystal grains. The time for heat treatment has a less significant influence on the structure and, taking the productivity into consideration, a duration of one or two hours is adequate.

Following the heat treatment, the copper plate is lathed or otherwise machined to a target shape. The machining conditions must be carefully controlled since they dictate the formation of a deformed layer in the final product. Recommended lathing conditions are: turning velocity, 40–80 rpm; cutting tool feed, 0.1–0.2 mm; and depth of cut, 0.1–0.2 mm. Machining conditions are correlated with productivity, and high-speed operation is beneficial for productivity but can lead to the inclusion of a deformed layer. Hence the above-mentioned conditions are desirable. The copper plate that has been machined to a desired shape is then bonded to a backing plate and is ready for use as a sputtering target.

EXAMPLES

The invention is illustrated by the following examples and comparative examples.

In Examples 1–4 and Comparative Examples 2–3, targets were made each from a high-purity copper ingot obtained by electro-refining an electrolytic copper in a nitric acid bath and then melting by vacuum induction. Comparative Example 1 represents a target made from a low-purity copper ingot. The targets were in the form of a disk each, measuring 12.98 in. in diameter and 6.35 mm thick.

Example 1

Target A

Electrolytic copper was electrorefined in a nitric acid bath with anode and cathode separated by a partition film and was vacuum melted to make a high-purity copper ingot (157 mm dia. and 60 mm thick). The ingot was heated to 600° C. and hot forged to dimensions 190 mm dia. and 40 mm thick. It was again heated to 600° C. and rolled to 265 mm dia. and 20 mm thick. Following this, it was cold rolled to 360 mm dia. and 10 mm thick and then heat treated at 400° C. for one hour. The work was lathed to a disk shape 12.98 in. dia. and 6.35 mm thick, and the disk was bonded to a backing plate to complete a target. The conditions for lathing were: turning velocity, 70 rpm; depth of cut, 0.15 mm; and cutting tool feed, 0.12 mm.

Example 2

Target B

The same ingot as used in Example 1 was hot rolled at 600° C. to dimensions 300 mm dia. and 15 mm thick and then cold rolled to 360 mm dia. and 10 mm thick. The resulting plate was heat treated at 400° C. for one hour, and under the same conditions as in Example 1, a target was made.

Example 3

Target C

Starting with the ingot of Example 1, the process steps of Example 1 were followed down to cold rolling. The rolled plate was heat treated at 550° C. for one hour and then subjected to the same machining conditions as in Example 1 to make a target.

Example 4

Target D

The same ingot as used in Example 1 was hot forged, cold rolled, and hot rolled under the same conditions of Example 1 to obtain a disk-shaped copper plate 360 mm dia. and 10 mm thick. This copper plate was lathed at a speed of 70 rpm, cut of depth of 0.4 mm and tool feed of 0.3 mm to the shape of a target.

Comparative Example 1

Target E

From a copper ingot obtained by vacuum induction melting an electrolytic copper with a purity of 99.95%, a target was made following exactly the same process steps as used in Example 1.

Comparative Example 2

Target F

The same ingot of the 99.95% purity as used in Comparative Example 1 (157 mm dia. and 60 mm thick) was hot rolled at 600° C. to a size 360 mm dia. and 10 mm thick. Without a subsequent heat treatment, the work was lathed under the same conditions as in Example 1 to make a target.

Comparative Example 3

Target G

The ingot of the 99.95% purity as used in Comparative Example 1 (157 mm dia. and 60 mm thick) was hot rolled at 600° C. to dimensions 265 mm dia. and 20 mm thick and then cold rolled to 360 mm dia. and 10 mm thick. Without a heat treatment but under the same conditions as in Example 1 the work was lathed to a target.

Quantities of Impurities

The quantities of impurities are listed in Table 1.

Target Characteristics

The above-mentioned Targets A to G had grain sizes with dispersions and diffraction peak intensity ratios of the (111) plane and the (200) plane with dispersions as shown in Table 2.

For the measurements of each target, samples were cut out m from a total of 9 points shown in FIG. 1. Grain sizes were determined by the scission method stipulated in JIS (Japanese Industrial Standards) H501.

Film Deposition Test

Each of Targets A to G was used to deposit a film on an 8 in.-dia. Si substrate at an Ar gas pressure of 5 mTorr, sputter power of 3 kW, and substrate-target distance of 50 mm. The resistivity of the film and the dispersion of the film thickness distribution were evaluated.

Table 3 shows resistivities, thickness distribution dispersions, and film thicknesses necessary for dummy runs. By the film thickness for dummy run is meant the film thickness accumulated on the wafer till the film thickness distribution dispersion reaches the numerical value given in Table 3.

DOCUMENT CARRYING CHEMICAL
FORMULA OR THE LIKE

Specification

TABLE 1

| Target | Unit | Ex. 1 A | Ex. 2 B | Ex. 3 C | Ex. 4 D | Comp. Ex. 1 E | Comp. Ex. 2 F | Comp. Ex. 3 G |
|---|---|---|---|---|---|---|---|---|
| Na | ppm | 0.005 | 0.005 | 0.005 | 0.005 | 0.04 | 0.04 | 0.04 |
| K |  | 0.005 | 0.005 | 0.005 | 0.005 | 0.05 | 0.05 | 0.05 |

TABLE 1-continued

| Target | Unit | Ex. 1 A | Ex. 2 B | Ex. 3 C | Ex. 4 D | Comp. Ex. 1 E | Comp. Ex. 2 F | Comp. Ex. 3 G |
|---|---|---|---|---|---|---|---|---|
| Fe |  | 0.03 | 0.03 | 0.03 | 0.03 | 0.9 | 0.9 | 0.9 |
| Ni |  | 0.008 | 0.008 | 0.008 | 0.008 | 1.0 | 1.0 | 1.0 |
| Cr |  | 0.002 | 0.002 | 0.002 | 0.002 | 0.1 | 0.1 | 0.1 |
| Al |  | 0.04 | 0.04 | 0.04 | 0.04 | 0.05 | 0.05 | 0.05 |
| Ca |  | 0.02 | 0.02 | 0.02 | 0.02 | 0.2 | 0.2 | 0.2 |
| Mg |  | 0.01 | 0.01 | 0.01 | 0.01 | 2 | 2 | 2 |
| C |  | 0.05 | 0.05 | 0.05 | 0.05 | 1 | 1 | 1 |
| O |  | 1 | 1 | 1 | 1 | 4 | 4 | 4 |
| Si |  | 0.1 | 0.1 | 0.1 | 0.1 | 5 | 5 | 5 |
| Ag |  | 0.2 | 0.2 | 0.2 | 0.2 | 15 | 15 | 15 |
| Ti |  | 0.03 | 0.03 | 0.03 | 0.03 | 5 | 5 | 5 |
| B |  | 0.004 | 0.004 | 0.004 | 0.004 | 0.6 | 0.6 | 0.6 |
| Zr |  | 0.02 | 0.02 | 0.02 | 0.02 | 7 | 7 | 7 |
| Hf |  | 0.006 | 0.006 | 0.006 | 0.006 | 0.9 | 0.9 | 0.9 |
| U | ppb | 0.1 | 0.1 | 0.1 | 0.1 | 1.8 | 1.8 | 1.8 |
| Th |  | 0.1 | 0.1 | 0.1 | 0.1 | 1.6 | 1.6 | 1.6 |

TABLE 2

| Target | Ex. 1 A | Ex. 2 B | Ex. 3 C | Ex. 4 D | Comp. Ex. 1 E | Comp. Ex. 2 F | Comp. Ex. 3 G |
|---|---|---|---|---|---|---|---|
| Grain size (µm) | 150 | 200 | 460 | 150 | 120 | 250 | —* |
| Dispersion of average grain size (%) | ±14 | ±19 | ±28 | ±14 | ±18 | ±20 | —* |
| I(111)/I(200) | 5.2 | 2.5 | 4.8 | 5.2 | 5.1 | 1.5 | 0.5 |
| Dispersion of peak intensity ratio (%) | ±11 | ±19 | ±14 | ±11 | ±13 | ±25 | ±21 |
| Half width (deg) | 0.16 | 0.20 | 0.11 | 0.34 | 0.17 | 0.17 | 0.17 |

*Comparative Example 3 involved no recrystallization, and therefore the grain size and the dispersion of average grain size could not be measured.

TABLE 3

| Target | Ex. 1 A | Ex. 2 B | Ex. 3 C | Ex. 4 D | Comp. Ex. 1 E | Comp. Ex. 2 F | Comp. Ex. 3 G |
|---|---|---|---|---|---|---|---|
| Resist'y (µΩ · cm) | 1.85 | 1.85 | 1.85 | 1.85 | 2.2 | 2.2 | 2.2 |
| Thickness distri.dispn σ (%) | 1.5 | 1.8 | 2.3 | 1.5 | 1.5 | 2.5 | 4.0 |
| Deposition thickness necessary for dummy run* (µm) | 3 | 5 | 3 | 15 | 3 | 3 | 3 |

*The thickness for dummy run means the deposition film thickness required to be accumulated until the dispersion of the film thickness distribution reaches the value given in Table 3.

Results

The films formed using the high-purity copper sputtering targets according to the invention had very low resistivities of no more than 2 µΩ·cm.

Excellent uniformity of film thickness distribution was exhibited by the films formed with the targets having an average grain size of 250 µm or less, grain size dispersion within plus or minus 20%, X-ray diffraction peak intensity ratio, I(111)/I(200), of no less than 2.4, and peak intensity ratio dispersion within plus or minus 20%.

It was confirmed that the film thickness necessary for a dummy run may not be great when the film is deposited using a target with a peak width at half height in the (111) plane of less than 0.3 deg.

Advantages of the Invention

The high-purity copper sputtering target according to this invention is capable of producing a copper film of extremely low resistivity of no more than 2 µΩ·cm and outstanding uniformity of film thickness distribution. Moreover, the film thickness of dummy run at the time of sputtering can be decreased.

Generally, there is a relation $$R = \mu \cdot L / S$$

where

R : resistance,

µ: specific resistivity,

L : length, and

S : cross sectional area.

Thus, in the case of a film with a resistivity of no more than 2 µΩ·cm made in conformity with this invention, the resistance can be kept low even after wire thinning.

Also, a relation $$Q = I^2 \cdot R$$

where

Q : Joule heat, and

I : current holds, and the current that flows being the same, the film evolves less Joule heat. Compared with a copper deposition film with a purity of 99.95%, a 99.9999%-pure copper film of the invention has a lower resistivity, by about 10%. Hence when the same circuit is made, according to the above equation, the film of this invention can reduce the quantity of Joule heat by about 10%.

Its low resistivity reduces the delay of signal transmission and effects a saving of power consumption.

What is claimed is:

1. A high-purity copper sputtering target in disc form characterized in that said high-purity copper sputtering target comprises up to 0.1 ppm each of Na and K; up to 1 ppm each of Fe, Ni, Cr, Al, Ca, Mg; up to 5 ppm each carbon and oxygen; up to 1 ppb each U and Th; and, excluding gaseous constituents, more than 99.999% copper, wherein an average grain size on a sputter surface of said copper sputtering target is 250 µm or below and a dispersion of the average grain size from location to location is within plus or minus 20%.

2. The sputtering target according to claim 1, wherein said copper sputtering target further comprises up to 5 ppm each Si, Ag, Ti, Zr, Hf, and B.

3. The sputtering target according to claim 1, wherein said sputtering target has an electric resistance of 1.9 µΩ·cm or less.

4. The sputtering target according to claim 1, wherein an X-ray diffraction peak width at half height in the sputter surface on a (111) plane is 2θ≦0.3 deg.

5. A thin high-purity copper film characterized by an electric resistance of 2.0 µΩ·cm or less produced by sputtering with a high-purity copper sputtering target according to claim 1.

6. A high-purity copper sputtering target in disc form characterized in that said high-purity copper sputtering target comprises up to 0.1 ppm each of Na and K; up to 1 ppm each of Fe, Ni, Cr, Al, Ca, Mg; up to 5 ppm each carbon and oxygen; up to 1 ppb each U and Th; and, excluding gaseous constituents, more than 99.999% copper, wherein said sputtering target has an electric resistance of 1.9 µΩ·cm or less, and wherein a ratio of an X-ray diffraction peak intensity I(111) on a (111) plane to an X-ray diffraction peak intensity I(200) on a (200) plane is at least 2.4, and a dispersion of the ratio of said X-ray diffraction peak intensity I(111) to said peak intensity I(200) in a sputter surface of the copper sputtering target is within plus or minus 20%.

7. The sputtering target according to claim 6, wherein said copper sputtering target further comprises up to 5 ppm each Si, Ag, Ti, Zr, Hf, and B.

8. The sputtering target according to claim 6, wherein an X-ray diffraction peak width at half height in the sputter surface on the (111) plane is 2θ≦0.3 deg.

9. A thin high-purity copper film characterized by an electric resistance of 2.0 µΩ·cm or less produced by sputtering with a high-purity copper sputtering target according to claim 6.

10. A high-purity copper sputtering target in disc form characterized in that said high-purity copper sputtering target comprises up to 0.1 ppm each of Na and K; up to 1 ppm each of Fe, Ni, Cr, Al, Ca, Mg; up to 5 ppm each carbon and oxygen; up to 1 ppb each U and Th; and, excluding gaseous constituents, more than 99.999% copper, wherein said sputtering target has an electric resistance of 1.9 µΩ·cm or less, and wherein an average grain size on a sputter surface of said copper sputtering target is 250 µm or below and a dispersion of the average grain size from location to location is within plus or minus 20% and a ratio of an X-ray diffraction peak intensity I(111) on a (111) plane to an X-ray diffraction peak intensity I(200) on a (200) plane is at least 2.4, and wherein a dispersion of the ratio of said X-ray diffraction peak intensity I(111) to said peak intensity I(200) in the sputter surface of the copper sputtering target is within plus or minus 20%.

11. The sputtering target according to claim 10, wherein said copper target further comprises up to 5 ppm each Si, Ag, Ti, Zr, Hf, and B.

12. The sputtering target according to claim 10, wherein an X-ray diffraction peak width at half height in the sputter surface on the (111) plane is 2θ≦0.3 deg.

13. A thin high-purity copper film characterized by an electric resistance of 2.0 µΩ·cm or less produced by sputtering with a high-purity copper sputtering target according to claim 10.

* * * * *